United States Patent [19]

Murakami et al.

[11] Patent Number: 5,525,584
[45] Date of Patent: Jun. 11, 1996

[54] SUPERCONDUCTOR AND METHOD OF PRODUCING SAME

[75] Inventors: Masato Murakami, Kamakura; Sang-Im Yoo, Tokyo; Naomichi Sakai, Ayase; Hiroshi Takaichi, Takamatsu; Takamitsu Higuchi, Kunitachi; Shoji Tanaka, Tokyo, all of Japan

[73] Assignees: International Superconductivity Technology Center; Railway Technical Research Institute; Shikoku Denryoku Kabushikigaisha; Tosoh Corporation, all of, Japan

[21] Appl. No.: 452,138

[22] Filed: May 26, 1995

Related U.S. Application Data

[62] Division of Ser. No. 364,796, Dec. 27, 1994.

[30] Foreign Application Priority Data

Dec. 27, 1993 [JP] Japan .................. 5-333886
Feb. 18, 1994 [JP] Japan .................. 6-021492

[51] Int. Cl.⁶ .................. H01B 12/00; H01C 39/12
[52] U.S. Cl. .................. 505/450; 505/500; 505/742; 505/778; 252/518; 252/521
[58] Field of Search .................. 505/450, 451, 505/500, 742, 778; 252/518, 521

[56] References Cited

U.S. PATENT DOCUMENTS 5,049,542  9/1991  Brass et al. .................. 505/742

FOREIGN PATENT DOCUMENTS 281753  9/1988  European Pat. Off. .

OTHER PUBLICATIONS

Wada et al "High Transition Temperature Superconductor $LaBa_2Cu_3O_4$..." Appl. Phys. Lett. vol. 52, No. 23, Jun. 1988 pp. 1989–1991.
Brass et al "Synthesis of $LaBa_2Cu_3O_{7-y}$ through Tetragonal to Orthorhombic..." Appl. Phys. Lett. vol. 53, No. 22, Nov. 1988 pp. 2235–2237.
Tajima et al "Composition Dependence of the Physical Properties in the Superconducting Y—Ba—Cu—O System" Jap. Jour. of App. Phys. vol. 26, No. 5, May 1987 pp. 2845–2847.

*Primary Examiner*—Paul Lieberman
*Assistant Examiner*—M. Kopec
*Attorney, Agent, or Firm*—Lorusso & Loud

[57] ABSTRACT

A high critical temperature and high critical current density superconductor is disclosed which contains a metal oxide expressed by the following formula (I):

$$(R^1_{1-x}Ba_x)Ba_2Cu_3O_d \qquad (I)$$

wherein $R^1$ stands for at least one element selected from the group consisting of La, Nd, Sm, Eu and Gd, x is a number greater than 0 but not greater than 0.5 and d is a number between 6.2 and 7.2. Fine phases of RE211, RE422 and/or a metal oxide expressed by the formula $(R^2_{1-z}, Ba_z)(Ba_{1-y}, R^2_y)_2Cu_3O_p$ ($R^2$=La, Nd, Sm, Eu or Gd) may be dispersed in a matrix of the matrix phase of the formula (I). The above superconductor may be obtained by cooling a melt having a temperature of 1,000°–1,300° C. and containing $R^1$, Ba, Cu and O at a cooling rate of 5° C./hour or less under a partial pressure of oxygen of between 0.00001 and 0.05 atm, followed by annealing at 250°–600° C. in an oxygen atmosphere.

3 Claims, 8 Drawing Sheets

SUPERCONDUCTOR AND METHOD OF PRODUCING SAME

This application is a division of application Ser. No. 08/364,796, filed Dec. 27, 1994.

BACKGROUND OF THE INVENTION

This invention relates to a superconductor having a high critical temperature and a high critical electrical current and to a method of producing same.

Recent development of a melt processing technique has enabled the production of excellent superconductors. One such melt processing technique is a melt-powder-melt-growth (MPMG) process by which a superconductor containing a $Y_2BaCuO_5$ (Y211) phase dispersed in a $YBa_2Cu_3O_y$ (Y123) phase and having a high critical electrical current can be obtained ("Melt Processed High Temperature Superconductor", M. Murakami, World Scientific, 1993). Such a superconductor can create a large electromagnetic force upon interaction with a magnetic field and may be utilizable for bearings, flywheels, transporting devices, etc.

Another known melt processing technique is a process in which a large crystal, such as of Y123, having controlled crystal orientation is grown using a seed crystal such as of La123, Nd123 or Sm123. A large crystal with controlled crystal orientation is desirable for application to magnetic shield and permanent magnet.

Known RE123 (RE: rare earth element) superconductors have a serious problem that part of the Ba site is substituted by RE ion which has a large ionic radius so that the critical temperature is lowered (H. Uwe et al, Physica C, vol. 153–155, p. 930–931 (1988)).

With regard to a sintering method, there is a proposal in which a RE123 superconductor is produced in a nitrogen atmosphere and the resulting product is subsequently oxidized so as to prevent the lowering of the critical temperature (T. Wada et al, J. Am. Ceram. Soc., 72, 2000–2003 (1989)). The superconductor thus prepared is, however, still unsatisfactory and cannot be put into practice, because the superconducting transition occurs through a wide temperature range and because the volume fraction of the superconducting phase is small. This is perhaps attributed to the fact that the sintering method, which utilizes a solid state reaction, is susceptible to an influence of the solid solution region and solid state diffusion for homogenization of Nd on Ba sites is very sluggish so that substitution of Ba ion with RE ion significantly occurs.

SUMMARY OF THE INVENTION

It is, therefore, an object of the present invention to provide a superconductor which has a high superconducting critical temperature and a high critical current and which is useful for many applications such as magnetic levitation, magnetic shield and superconducting bulk magnets.

Another object of the present invention is to provide a superconductor having a superconducting critical temperature of at least 90 K.

It is a further object of the present invention is to provide a process which can produce a superconductor having both a high critical temperature and a high critical electrical current.

In accomplishing the foregoing objects, the present invention provides a superconductor comprising a metal oxide expressed by the following formula (I):

$$(R^1{}_{1-x}Ba_x)Ba_2Cu_3O_d \tag{I}$$

wherein $R^1$ stands for at least one element selected from the group consisting of La, Nd, Sm, Eu and Gd and x and d are numbers as follows:

$$0 < x \leq 0.5$$

$$6.2 \leq d \leq 7.2.$$

In another aspect, the present invention provides a superconductor comprising a matrix phase of a metal oxide expressed by the following formula (I):

$$(R^1{}_{1-x}Ba_x)Ba_2Cu_3O_d \tag{I}$$

wherein $R^1$ stands for at least one element selected from the group consisting of La, Nd, Sm, Eu and Gd and x and d are numbers as follows:

$$0 \leq x \leq 0.5$$

$$6.2 \leq d \leq 7.2, \text{ and}$$

a multiplicity of regions dispersed in said matrix phase and each composed of a metal oxide expressed by the following formula (II):

$$(R^2{}_{2-z}Ba_z)(Ba_{1-y}R^2{}_y)_2Cu_3O_p \tag{II}$$

wherein $R^2$ stands for at least one element selected from the group consisting of La, Nd, Sm, Eu and Gd and z, y and p are numbers as follows:

$$0 \leq x \leq 0.5$$

$$0 < y \leq 0.5$$

$$6.2 \leq p \leq 7.2.$$

In a further aspect, the present invention provides a superconductor comprising a matrix phase of a metal oxide expressed by the following formula (I):

$$(R^1{}_{1-x}Ba_x)Ba_2Cu_3O_d \tag{I}$$

wherein $R^1$ stands for at least one element selected from the group consisting of La, Nd, Sm, Eu and Gd and x and d are numbers as follows:

$$0 \leq x \leq 0.5$$

$$6.2 \leq d \leq 7.2, \text{ and}$$

a multiplicity of regions dispersed in said matrix phase and each composed of at least one member selected from the group consisting of (a) a metal oxide expressed by the following formula (III):

$$R^3{}_{4-w}Ba_{2+w}Cu_2O_{10-q} \tag{III}$$

wherein $R^3$ stands for at least one element selected from the group consisting of La and Nd and w and q are numbers as follows:

$$0 \leq w \leq 0.2$$

$$0 \leq q \leq 0.5, \text{ and}$$

(b) a metal oxide expressed by the following formula (IV):

$$R^4_2BaCuO_5 \qquad (IV)$$

wherein $R^4$ stands for at least one element selected from the group consisting of Sm, Y, Eu, Gd, Dy, Ho, Er and Yb, the amount of said regions being not greater than 40 % by weight based on the total weight of said matrix phase and said regions.

In a still further aspect, the present invention provides a superconductor comprising a matrix phase of a metal oxide expressed by the following formula (I):

$$(R^1_{1-x}Ba_x)Ba_2Cu_3O_d \qquad (I)$$

wherein $R^1$ stands for at least one element selected from the group consisting of La, Nd, Sm, Eu and Gd and x and d are numbers as follows:

$$0 \leq x \leq 0.5$$

$$6.2 \leq d \leq 7.2,$$

a multiplicity of first regions dispersed in said matrix phase and each composed of a metal oxide expressed by the following formula (II):

$$(R^2_{1-z}Ba_z)(Ba_{1-y}R^2_y)_2Cu_3O_p \qquad (II)$$

wherein $R^2$ stands for at least one element selected from the group consisting of La, Nd, Sm, Eu and Gd and z, y and p are numbers as follows:

$$0 \leq z \leq 0.5$$

$$0 < y \leq 0.5$$

$$6.2 \leq p \leq 7.2, \text{ and}$$

a multiplicity of second regions dispersed in said matrix phase and each composed of at least one member selected from the group consisting of (a) a metal oxide expressed by the following formula (III):

$$R^3_{4-w}Ba_{2+w}Cu_2O_{10-q} \qquad (III)$$

wherein $R^3$ stands for at least one element selected from the group consisting of La and Nd and w and q are numbers as follows:

$$0 \leq w \leq 0.2$$

$$0 \leq q \leq 0.5, \text{ and}$$

(b) a metal oxide expressed by the following formula (IV):

$$R^4_2BaCuO_5 \qquad (IV)$$

wherein $R^4$ stands for at least one element selected from the group consisting of Sm, Y, Eu, Gd, Dy, Ho, Er and Yb, the amount of said second regions being not greater than 40 % by weight based on the total weight of said matrix phase and said first and second regions.

The present invention also provides a process for the production of the above superconductor, comprising providing a melt having a temperature of 1,000°–1,300° C. and containing $R^1$, Ba, Cu and O in such amounts that the content of $R^1$ is 0.3–0.6 mole, the content of Ba is 0.6–0.8 mole and the content of O is 2.1–2.7 moles each per mole of Cu, and cooling said melt at a cooling rate of 5° C./hour or less under a partial pressure of oxygen of between 0.00001 and 0.05 atm, thereby to form a superconducting phase.

FIG. 1 illustrates a ternary phase diagram of a $RE_2O_3$—BaO—CuO system, in which RE represents a rare earth element having a large ionic radius such as La, Nd, Sm, Eu or Gd. Because a $RE_{1+x}Ba_{2-x}Cu_3O_y$ (x>0, 6.8<y <7.2) phase formed as a result of the substitution of RE for a part of the Ba sites of a RE123 phase is as stable as the RE123 phase in air, a solid solution region as shown in FIG. 1 exists. In such a solid solution phase, the carrier concentration is reduced by the substitution of the trivalent ion for the divalent ion to cause the lowering of the critical temperature. The range of the solid solution region varies with the kind of RE. It is to be noted that RE422 phase is formed in the case where RE is La or Nd, while RE211 phase is formed in the case where RE is Sm, Eu or Gd.

The present inventors have unexpectedly found that when a RE—Ba—Cu—O superconductor is produced from a melt while maintaining the oxygen partial pressure in a range of 0.00001–0.05 atm, substitution of RE for part of Ba site is prevented and, rather, Ba ion substitutes for a part of the RE ion. As a consequence the resulting superconductor has a high critical temperature. In FIG. 1, designated as P is the range of solid solution in the present invention, while Q designates the range of solid solution when processed in air.

It has also been found that the formation of dispersed phases each formed of a metal oxide of the above formula (II) in a matrix phase of a metal oxide of the above formula (I) gives a pinning effect superior to that attained in the known system containing Y211 phases dispersed in a Y123 matrix phase, so that the superconductor shows a high critical current even in a strong magnetic field. Each of the dispersed phases preferably has a diameter of not greater than 1 μm.

The presence of dispersed phases of a metal oxide of the above formula (III) or (IV) in aria mount of not greater than 40 % by volume has also been found to be effective in obtaining a pinning effect. The 211 or 422 phase generally has an average diameter of not greater than 30 μm.

BRIEF DESCRIPTION OF THE DRAWINGS

Other objects, features and advantages of the present invention will become apparent from the detailed description of the preferred embodiments of the invention which follows, when considered in light of the accompanying drawings, in which.

DETAILED DESCRIPTION OF THE PREFERRED EMBODIMENT OF THE INVENTION

Figure 1:
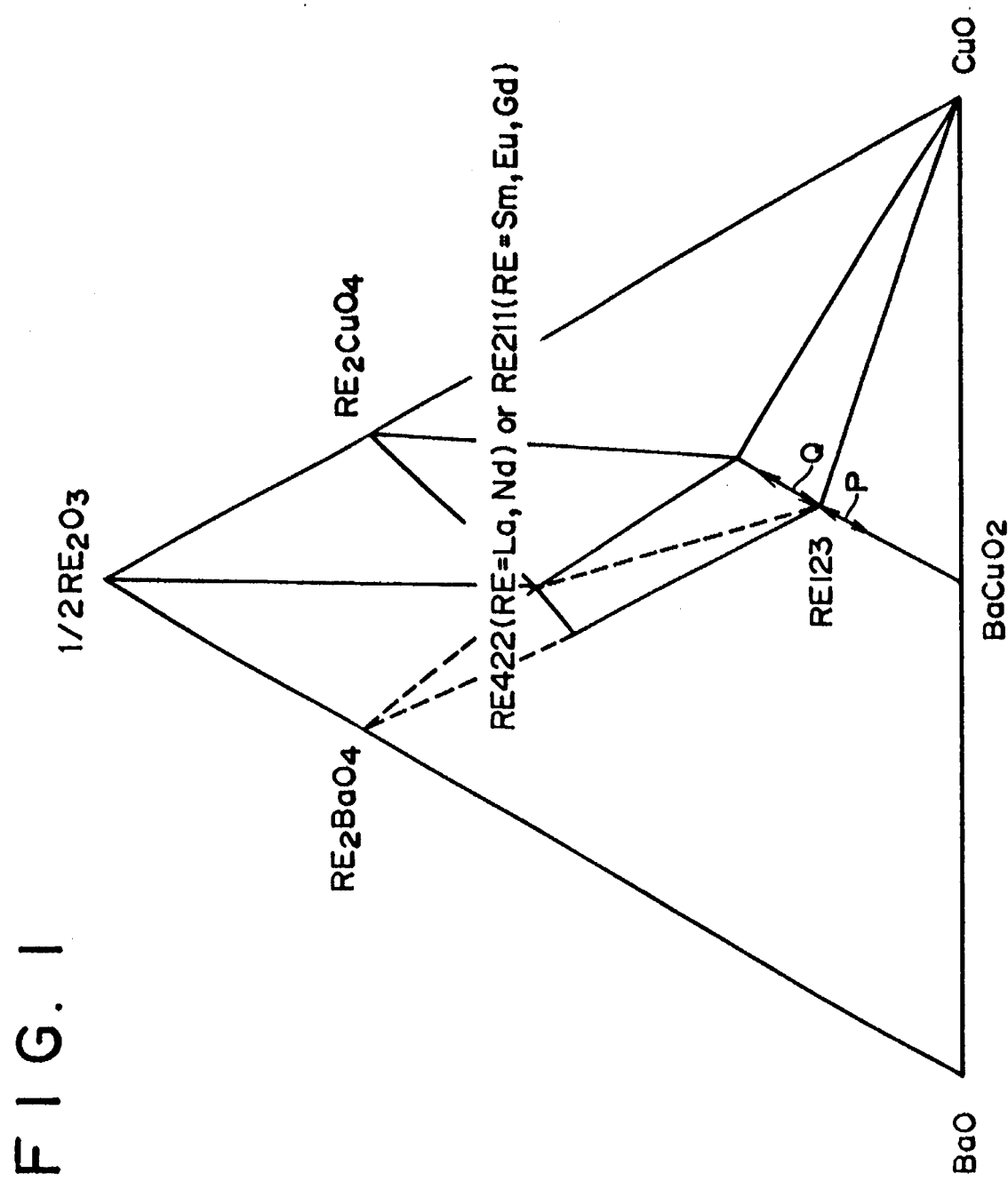
FIG. 1 is a ternary phase diagram of a $RE_2O_3$—BaO—CuO system, in which RE represents a rare earth element having a large ionic radius.

The superconductor according to the present invention may be produced by a process in which a melt containing $R^1$, Ba, Cu and O and preferably having a content of $R^1$ of 0.3–0.6 mole, a content of Ba of 0.6–0.8 mole and a content of O of 2.1–2.7 moles each per mole of Cu is cooled under a partial pressure of oxygen of between 0.00001 and 0.05 atm.

Any known melt processed method may be adopted for the purpose of the present invention so long as a metal oxide superconductor is grown from a melt. Thus, a method in which a single crystal superconductor is grown on a seed crystal in a melt may be adopted if desired. Oxides, organic or inorganic salts of respective metals may be generally used as raw materials for the formation of the melt.

It is important that the formation and growth of the crystal be performed under the above-specified oxygen partial pressure. An oxygen partial pressure below 0.00001 atm is disadvantageous because the superconducting phase is apt to be decomposed. When the oxygen partial pressure exceeds 0.05 atm, the substitution of Ba ion for part of the RE sites fails to occur satisfactorily. Preferably, the crystal growth is performed in the atmosphere of an inert gas such as argon or nitrogen while controlling the oxygen partial pressure as above.

It is also important that the melt should initially have a temperature of 1,000° C. to 1,300° C. since it is difficult to maintain the molten state when the temperature is lower than 1,000° C. and since the melt tends to react with a supporting member, such as a vessel, in which the melt is received when the temperature exceeds 1,300° C. The cooling rate should not be greater than 5° C. per hour since otherwise it is difficult to grow the crystal in a stable manner. It is preferred that the cooling of the melt be performed while maintaining a temperature gradient of 5° C./cm or more in a direction along which the crystal grows.

It is also preferred that the cooling step be followed by annealing in an atmosphere of oxygen. The annealing is generally performed at a temperature of 250°–600° C., preferably 300°–400° C. for a period of at least 10 hours, preferably 10 hours to 10 days.

The following examples will further illustrate the present invention.

EXAMPLE 1

Powders of $Nd_2O_3$, $BaCO_3$ and $CuO$ were mixed with each other with a ratio of Nd: Ba: Cu of 1: 2: 3. The mixture was calcined at 900° C. for 24 hours and placed in a platinum crucible. The contents in the crucible was then heated and fused at 1,400° C. for 20 minutes. The crucible was grasped with copper hammers and rapidly cooled. The cooled mass was pulverized and then shaped into a plate-like sample of a 50 mm×50 mm×20 mm size. Then, while being maintained under an oxygen partial pressure of 0.01 atm, the sample was heated to 1,120° C., maintained at that temperature for 20 minutes, cooled to 1,080° C. in 20 minutes and gradually cooled to 950° C. at a rate of 1° C./hour. This was further treated at 350° C. for 100 hours under an oxygen pressure of 1 atm to obtain a Nd—Ba—Cu—O superconductor according to the present invention.

Figure 2:
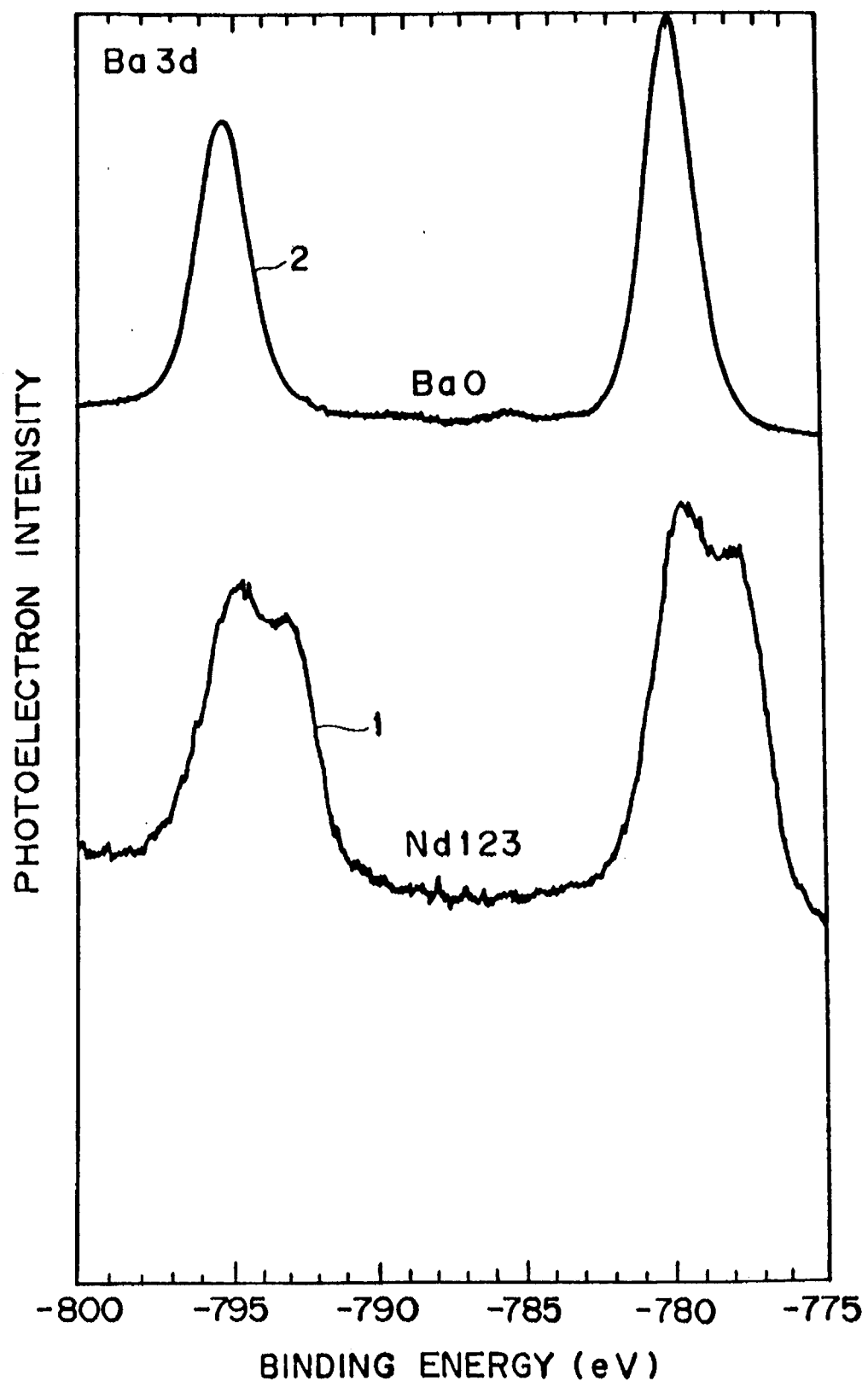
FIG. 2 shows X-ray photoelectron spectra of Ba 3d core electron of BaO and a Nd—Ba—Cu—O superconductor.
Figure 3:
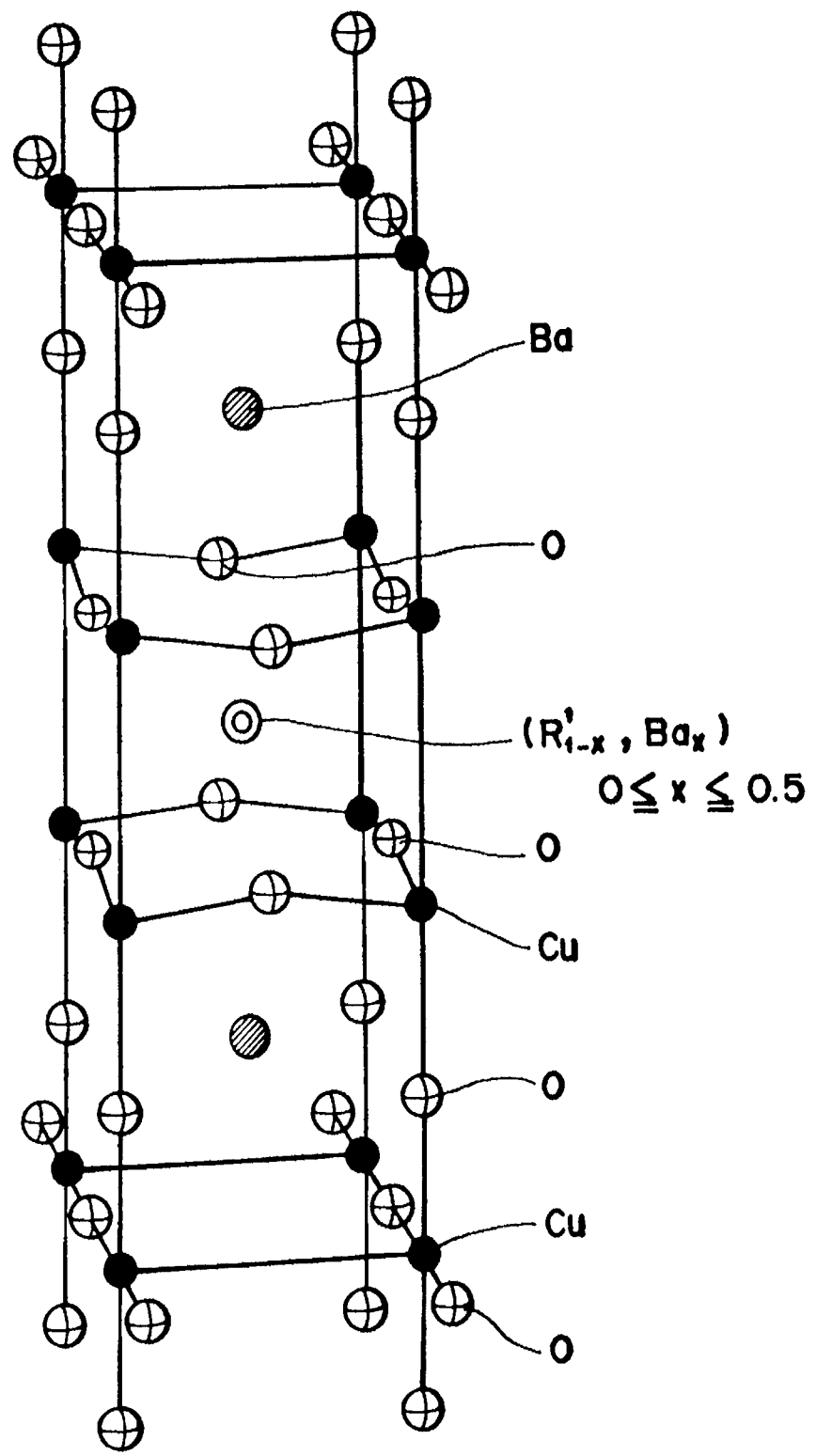
FIG. 3 is a diagram showing the crystal structure of a superconductor according to the present invention having a formula $(R^1_{1-x}, Ba_x)Ba_2Cu_3O_d$.

FIG. 2 shows a result of the measurement of the binding energy of 3d core electron of Ba of the Nd—Ba—Cu—O superconductor (Spectrum 1). The upper curve (Spectrum 2) shows a result of BaO and represents a result of divalent Ba ion. As seen from FIG. 2, the binding energy of Ba 3d core electron is shifted toward the low energy side, suggesting that a part of the Nd site is substituted by Ba ion. FIG. 3 schematically illustrate the crystal structure of the superconductor of the present invention.

Figure 4:
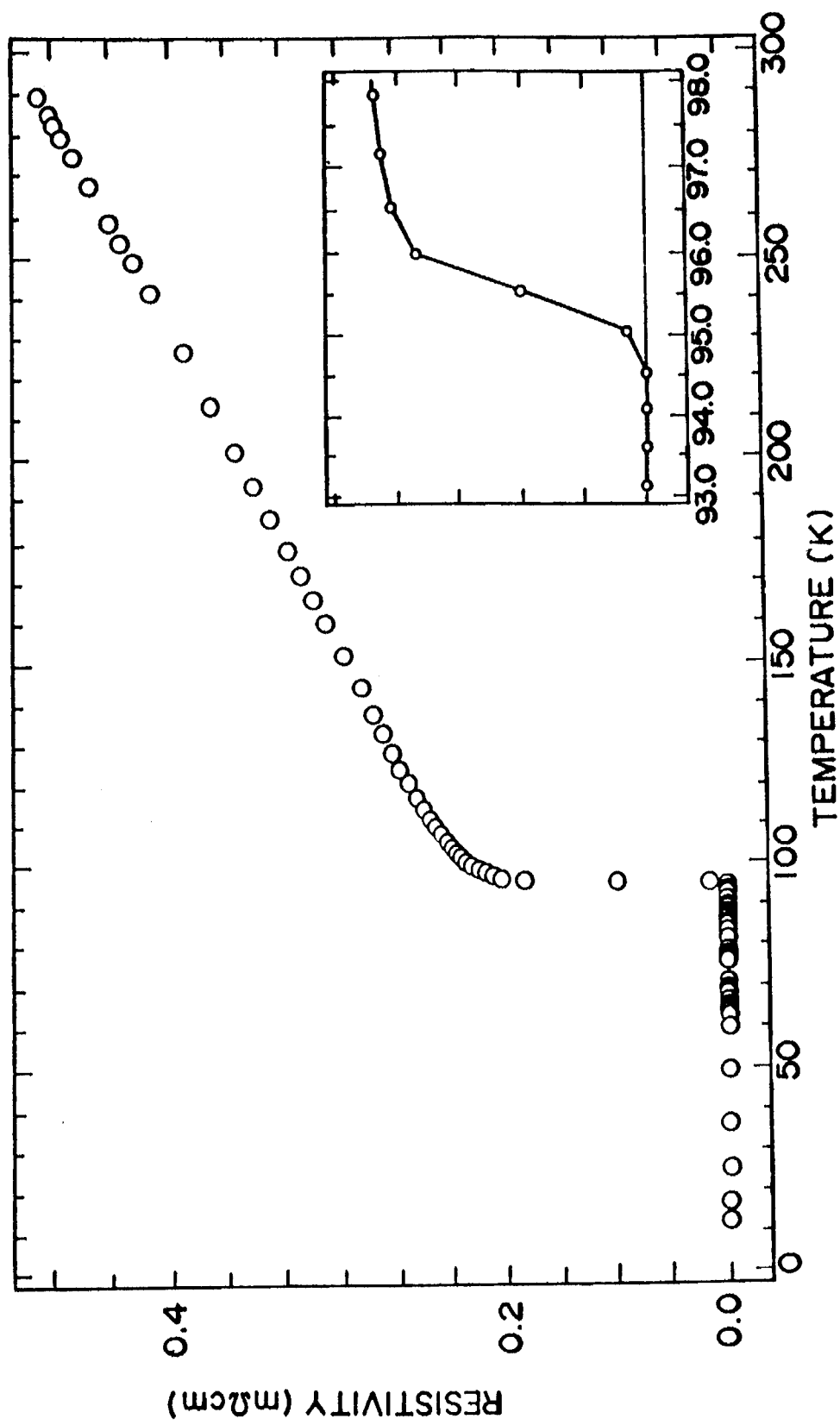
FIG. 4 is a graph showing a relationship between the electrical resistivity and the temperature of a superconductor obtained in Example 1.

As a result of the substitution of divalent Ba ion for a part of trivalent Nd ion, the hole concentration is increased so that the critical temperature is raised. FIG. 4 shows temperature dependence of the electrical resistivity of the above Nd—Ba—Cu—O superconductor. As will be appreciated from the result of FIG. 4, the superconducting transition occurs at a surprisingly very high temperature.

Figure 5:
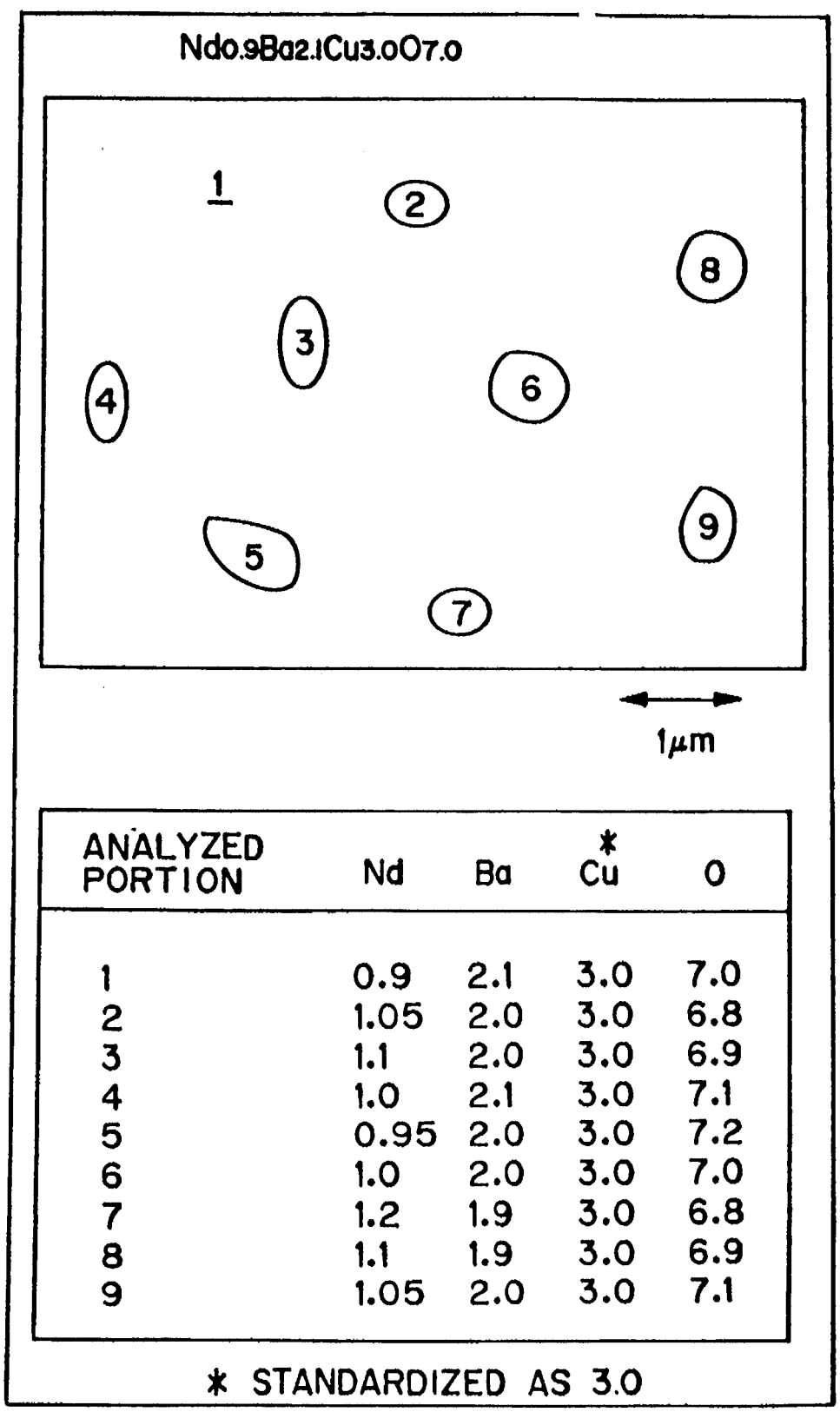
FIG. 5 is a diagram showing the results of analysis of the superconductor of Example 1 by an electron probe microanalyzer.

FIG. 5 shows the results of a compositional analysis of the Nd—Ba—Cu—O superconductor with an electron probe microanalyzer. The analysis reveals that the matrix phase has a chemical formula of $Nd_{0.9}Ba_{2.1}Cu_{3.0}O_{7.0}$, while the dispersed regions have a phase with a smaller Ba/Nd ratio. More detailed electron probe microanalysis using a transmission electron microscope revealed that the dispersed phases have the formula represented by $(Nd_{1-z}, Ba_z)(Ba_{1-y}, Nd_y)_2Cu_3O_p$, wherein z is a number greater than 0 but smaller than 0.5, y is a number greater than 0 but smaller than 0.5 and p is a number greater than 6.8 but smaller than 7.2. The dispersed regions each having a diameter of less than 1 μm show characteristics, such as critical temperature and critical current, different from those of the matrix. In particular, the superconductivity is destroyed under a strong magnetic field to cause transition into the normal conductivity. Since the intensity of the magnetic field which causes the normal conductivity transition varies with the composition of the dispersed regions, these dispersed regions can function as pinning centers in a wide range of the magnetic field.

Figure 6:
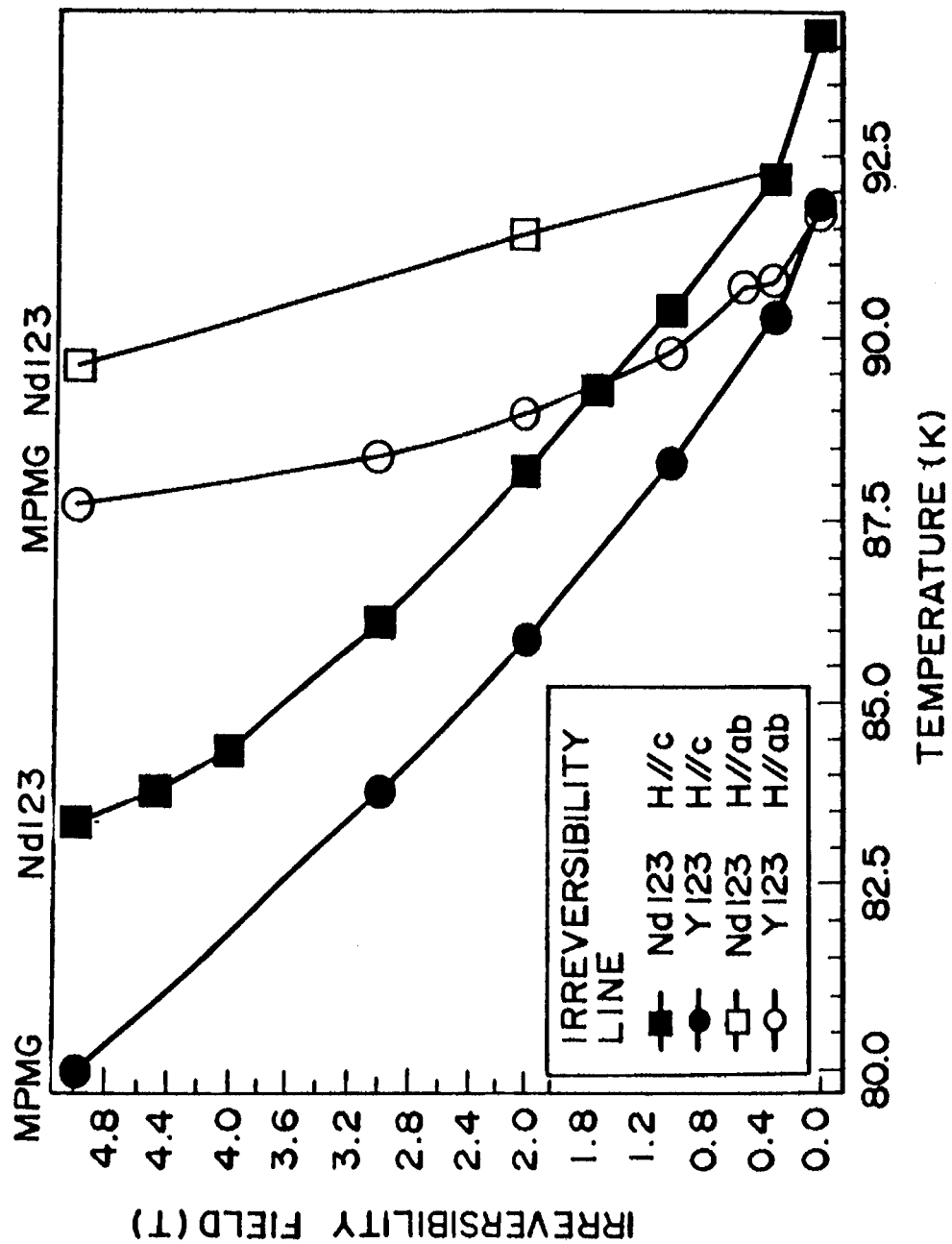
FIG. 6 is a graph showing a relationship between the irreversibility field and the temperature of the superconductor of Example 1 and a known superconductor produced by the MPMG method.

As a consequence of the presence of the dispersed phases with various compositions, the Nd—Ba—Cu—O superconductor according to the present invention gives a high irreversibility field as will be appreciated from FIG. 6. Since the maximum magnetic field above which a superconductor is not actually usable is determined by the irreversibility field thereof, the high irreversibility field attained in the Nd—Ba—Cu—O superconductor has a great significance.

Comparative Example 1

Example 1 was repeated in the same manner as described except that the melt grow process was performed in air. The analysis with an electron beam microanalyzer reveals that the resulting Nd—Ba—Cu—O superconductor has a formula: $Nd_{1.1}Ba_{1.9}Cu_{3.0}O_{6.9}$. This superconductor has a superconducting transition temperature of 85 K.

Comparative Example 2

Figure 7:
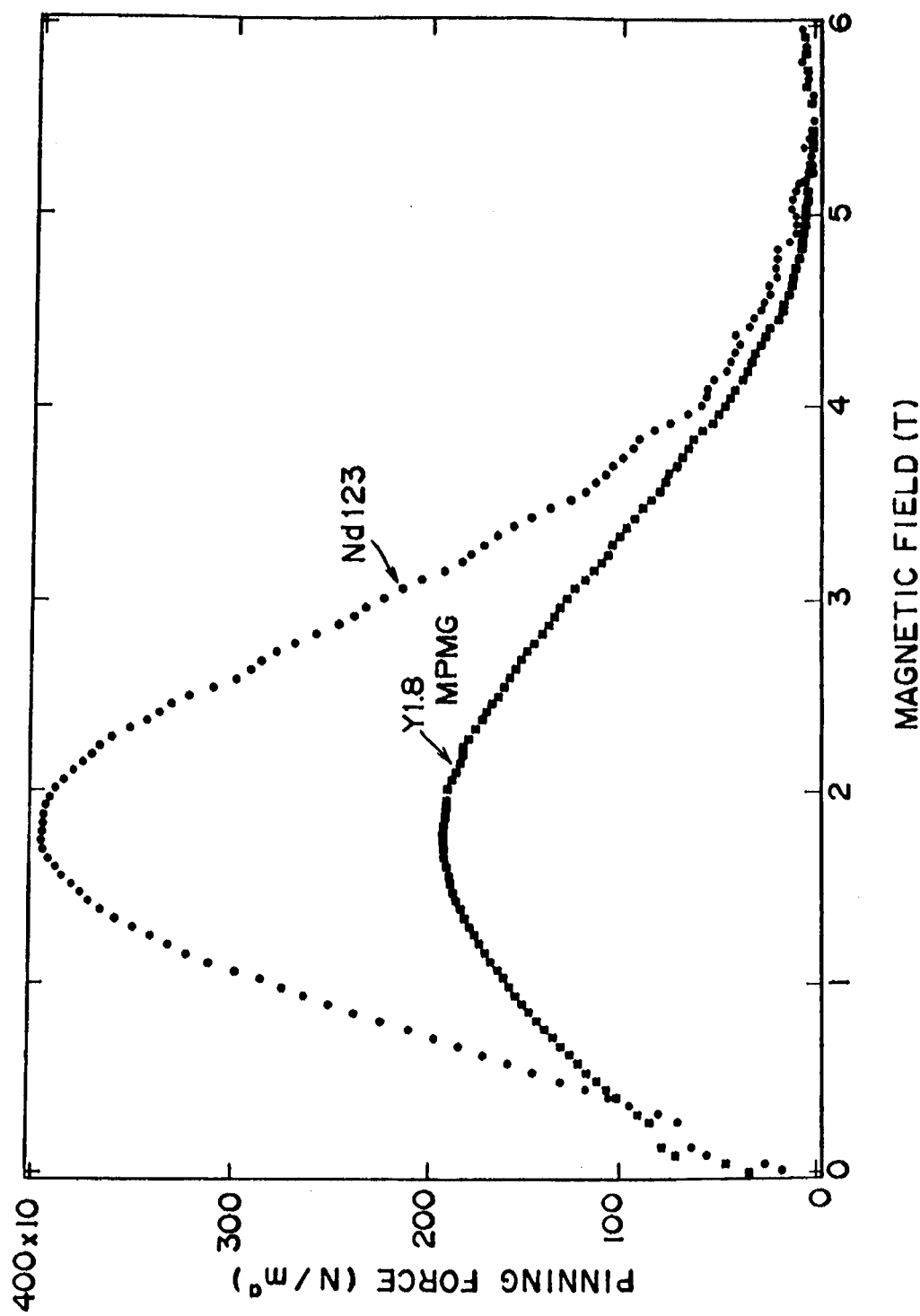
FIG. 7 is a graph showing a relationship between the pinning force and the magnetic field of the superconductor of Example 1 and the known superconductor.

Powders of $Y_2O_3$, $BaCO_3$ and $CuO$ were mixed with each other with a ratio of Y:Ba:Cu of 1.8:2.4:3.4. The mixture was calcined at 900° C. for 24 hours and placed in a platinum crucible. The contents in the crucible was then heated and fused at 1,400° C. for 20 minutes. The crucible was grasped with copper hammers and rapidly cooled. The cooled plate was pulverized and then shaped into a plate-like sample of a 50 mm×50 mm×20 mm size. Then, the sample was heated to 1,120° C., maintained at that temperature for 20 minutes, cooled to 1,080° C. in 20 minutes and gradually cooled to 950° C. at a rate of 1° C./hour in air. This was further treated at 500° C. for 100 hours under an oxygen pressure of 1 atm to obtain a Y—Ba—Cu—O superconductor containing fine-211 phases dispersed in a Y123 matrix phase. The irreversibility curve and the magnetic flux pinning curve of the Y—Ba—Cu—O superconductor are shown in FIGS. 6 and 7. As compared with the Y—Ba—Cu—O superconductor obtained by the conventional melt processing method, the Nd—Ba—Cu—O superconductor of the present invention shows a much higher irreversibility field (FIG. 6) and a higher pinning force (FIG. 7).

EXAMPLE 2

Powders of $Nd_2O_3$, $BaCO_3$ and CuO were mixed with each other with a ratio of Nd:Ba:Cu of (A) 1.2:2.1:3.1, (B) 1.4:2.2:3.2 and (C) 1.8:2.4:3.4. Each of the mixtures was processed in the same manner as described in Example 1 to obtain three plate-like samples. Then, while being maintained under an oxygen partial pressure of 0,001 atm, each of the samples was heated to 1,120° C., maintained at that temperature for 20 minutes, cooled to 1,080° C. in 20 minutes and gradually cooled to 950° C. at a rate of 1° C./hour. This was further treated at 350° C. for 100 hours under an oxygen pressure of 1 atm to obtain three Nd—Ba—Cu—O superconductors (A)–(C) according to the present invention. The superconductors (A)–(C) were found to contain Nd422 phases having formulas of $Nd_{3.9}Ba_{2.1}Cu_2O_{9.6}$, $Nd_{3.85}Ba_{2.15}Cu_2O_{9.7}$ and $Nd_{3.95}Ba_{2.05}Cu_2O_{9.6}$, respectively, dispersed in a matrix phase in an amount of about 9%, 16% and 29% by volume, respectively, and to have superconducting critical temperature of 93 K. 95 K. and 94 K. respectively.

EXAMPLE 3

Powders of $La_2O_3$, $BaCO_3$ and CuO were mixed with each other with a ratio of La:Ba:Cu of 1.2:2.1:3.1 and the mixture was processed in the same manner as described in Example 1 to obtain a plate-like sample. Then, while being maintained under an oxygen partial pressure of 0.01 atm, the sample was heated to 1,120° C., maintained at that temperature for 20 minutes, cooled to 1,080° C. in 20 minutes and gradually cooled to 900° C. at a rate of 1° C./hour. This was further treated at 350° C. for 100 hours under an oxygen pressure of 1 atm to obtain a La—Ba—Cu—O superconductor according to the present invention having a superconducting critical temperature of 90 K. For the purpose of comparison, the above procedure was repeated in the same manner as described except that the melt grow process was performed in air. The resulting superconductor had a critical temperature of 10 K.

EXAMPLE 4

Powders of $Sm_2O_3$, $BaCO_3$ and CuO were mixed with each other with a ratio of Sm:Ba:Cu of 1.2:2.1:3.1 and the mixture was processed in the same manner as described in Example 1 to obtain a plate-like samples. Then, while being maintained under an oxygen partial pressure of 0.01 atm, the samples was heated to 1,120° C., maintained at that temperature for 20 minutes, cooled to 1,060° C. in 20 minutes and gradually cooled to 900° C. at a rate of 1° C./hour. This was further treated at 350° C. for 100 hours under an oxygen pressure of 1 atm to obtain a Sm—Ba—Cu—O superconductor according to the present invention having a superconducting critical temperature of 92 K. For the purpose of comparison, the above procedure was repeated in the same manner as described except that the treatment of the melt grow process was performed in air. The resulting superconductor had a critical temperature of 65 K.

EXAMPLE 5

Powders of $Eu_2O_3$, $BaCO_3$ and CuO were mixed with., each other with a ratio of Eu:Ba:Cu of 1.2:2.1:3.1 and the mixture was processed in the same manner as described in Example 1 to obtain a plate-like samples. Then, while being maintained under an oxygen partial pressure of 0.01 atm, the samples was heated to 1,120° C., maintained at that temperature for 20 minutes, cooled to 1,040° C. in 20 minutes and gradually cooled to 900° C. at a rate of 1° C./hour. This was further treated at 350° C. for 100 hours under an oxygen pressure of 1 atm to obtain a Eu—Ba—Cu—O superconductor according to the present invention having a superconducting critical temperature of 92 K. For the purpose of comparison, the above procedure was repeated in the same manner as described except that the melt grow process was performed in air. The resulting superconductor had a critical temperature of 75 K.

EXAMPLE 6

Powders of $Gd_2O_3$, $BaCO_3$ and CuO were mixed with each other with a ratio of Gd:Ba:Cu of 1.2:2.1:3.1 and the mixture was processed in the same manner as described in Example 1 to obtain a plate-like samples. Then, while being maintained under an oxygen partial pressure of 0.01 atm, the samples was heated to 1,120° C., maintained at that temperature for 20 minutes, cooled to 1,020° C. in 20 minutes and gradually cooled to 900° C. at a rate of 1° C./hour. This was further treated at 350° C. for 100 hours under an oxygen pressure of 1 atm to obtain a Gd—Ba—Cu—O superconductor according to the present invention having a superconducting critical temperature of 93 K. For the purpose of comparison, the above procedure was repeated in the same manner as described except that the treatment of the melt grow process was performed in air. The resulting superconductor had a critical temperature of 80 K.

EXAMPLE 7

Powders of $Sm_2O_3$, $BaCO_3$ and CuO were mixed with each other with a ratio of Sm:Ba:Cu of 1:2:3 and the mixture was processed in the same manner as described in Example 1 to obtain a plate-like samples. Then, while being maintained under an oxygen partial pressure of 0.01 atm, the samples was heated to 1,120° C., maintained at that temperature for 20 minutes, cooled to 1,080° C. in 20 minutes and gradually cooled to 900° C. at a rate of 5° C./hour. This was further treated at 350° C. for 100 hours under an oxygen pressure of 1 atm to obtain a Sm—Ba—Cu—O superconductor according to the present invention having a superconducting critical temperature of 92 K. For the purpose of comparison, the above procedure was repeated in the same manner as described except that the cooling rate was increased to 10° C./hour. The resulting superconductor had a critical temperature of 80 K.

EXAMPLE 8

Powders of $Nd_2O_3$, $BaCO_3$ and CuO were mixed with each other with a ratio of Nd:Ba:Cu of 1:2:3 and the mixture was calcined at 950° C. for 24 hours. The calcined mixture was shaped into a pellet having a diameter of 2 cm and a height of 1 cm. Then, while being maintained under an oxygen partial pressure of 0.01 atm, the samples was heated to 1,100° C. in an electric oven, maintained at that temperature for 1 hour, cooled to 1,080° C., gradually cooled to 900° C. at a rate of 1° C./hour and allowed to be cooled to room temperature in the oven, to obtain a Nd—Ba—Cu—O superconductor according to the present invention having a superconducting critical temperature of 95 K.

EXAMPLE 9

Powders of $Sm_2O_3$, $BaCO_3$ and CuO were mixed with each other with a ratio of Sm:Ba:Cu of 1:2:3 and the mixture was calcined at 950° C. for 24 hours. The calcined mixture was shaped into a pellet having a diameter of 2 cm and a height of 1 cm. Then, while being maintained under an oxygen partial pressure of 0.01 atm, the samples was heated to 1,100° C. in an electric oven, maintained at that temperature for 1 hour, cooled to 1,080° C., gradually cooled to 900° C. at a rate of 1° C./hour and allowed to be cooled to room temperature in the oven, to obtain a Sm—Ba—Cu—O superconductor according to the present invention having a superconducting critical temperature of 92 K. The gradual cooling from 1,080° C. to 900° C. was performed while establishing a temperature gradient of 5° C./cm along the axis of the pellet. The X-ray diffraction analysis revealed that the (001) plane of the superconductor crystal was oriented in parallel with the direction of the temperature gradient. Similar results were obtained when the temperature gradient was increased to 10° C./cm and to 30° C./cm. In the absence of the temperature gradient, the crystal orientation was not formed though a critical temperature of 92 K. was obtained.

EXAMPLE 10

Powders of $Sm_2O_3$, $BaCO_3$ and CuO were mixed with each other with a ratio of Sm:Ba:Cu of 1:2:3. The mixture was calcined at 950° C. for 24 hours and placed in a platinum crucible. The contents in the crucible was then heated and fused at 1,400° C. for 20 minutes. The crucible was grasped with copper hammers and rapidly cooled. The cooled mass was pulverized and then shaped into a pellet having a diameter of 2 cm and a height of 1 cm. Then, while being maintained under an oxygen partial pressure of 0.01 atm, the sample was heated to 1,100° C., maintained at that temperature for 1 hour, cooled to 1,060° C., gradually cooled to 900° C. at a rate of 1° C./hour and then allowed to be cooled to room temperature. This was further treated at 350° C. for 100 hours under an oxygen pressure of 1 atm to obtain a Sm—Ba—Cu—O superconductor according to the present invention having a critical temperature of 93 K. The above procedure was repeated in the same manner as described except that the heat treatment of the pellet was performed under an oxygen partial pressure of 0.05 atm. The superconductor thus obtained also showed a critical temperature of 93 K.

Figure 8:
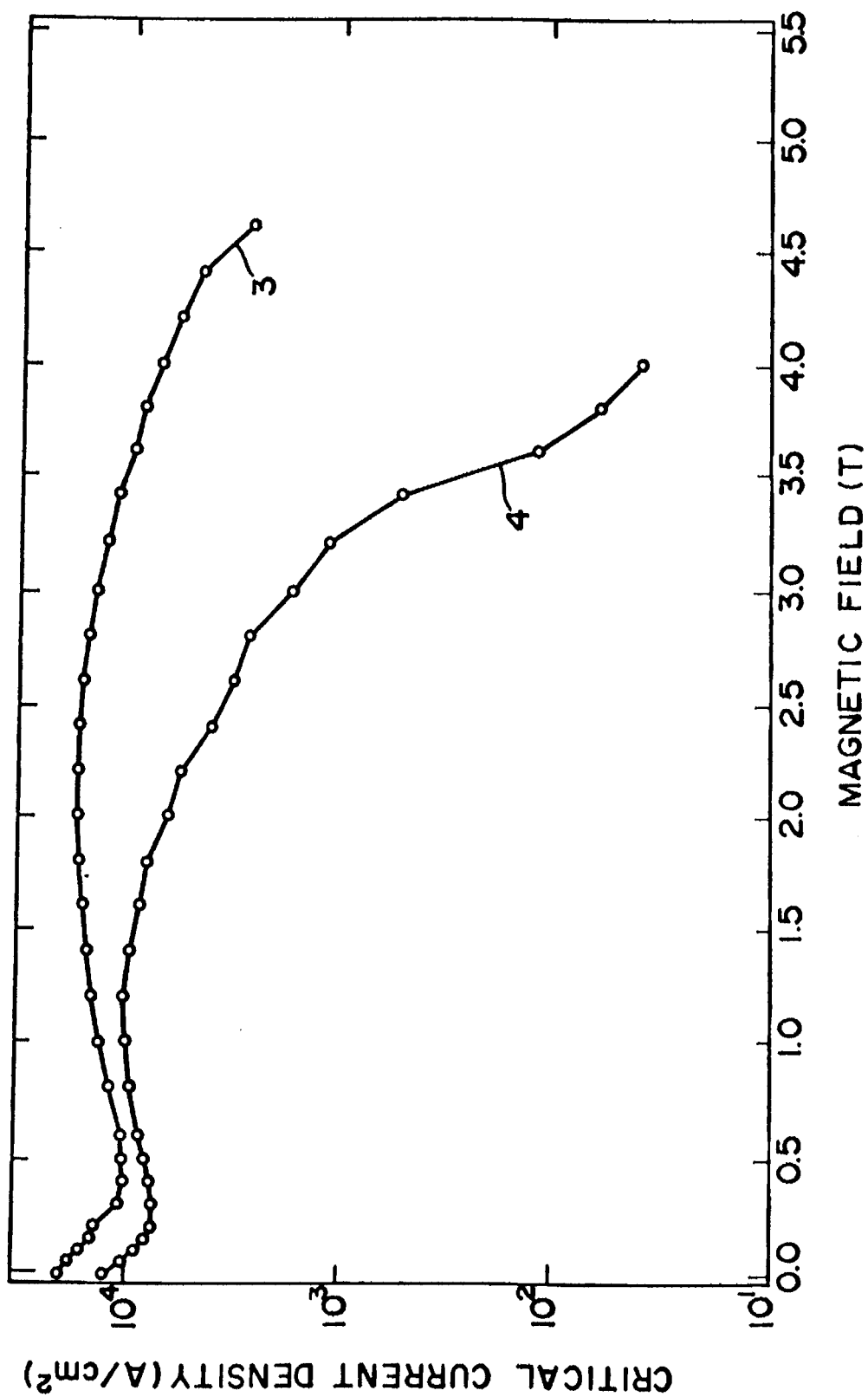
FIG. 8 is a graph showing a relationship between the critical current density and the magnetic filed of a superconductors obtained in Example 8.

FIG. 8 are graphs showing a relationship between the critical current density and the magnetic field of the Sm—Ba—Cu—O superconductors obtained above. The density was measured at 77 K. using a sample vibrating sample magnetometer in which the magnetic field was in parallel with the c-axis. As seen from FIG. 8, the superconductor melt processed under an oxygen partial pressure of 0.001 atm gives a higher critical current density (Curve 3) as compared with that melt processed under 0.05 atm (Curve 4).

EXAMPLE 11

Powders of $Nd_2O_3$, $BaCO_3$ and CuO were mixed with a ratio of Nd:Ba:Cu of 0.9:2.1:3.0. The mixture was calcined at 950° C. for 24 hours and placed in a platinum crucible. The contents in the crucible was then heated to 1,400° C. and held for 20 minutes. The melt was then quenched using copper hammers. The cooled mass was pulverized and then shaped into a pellet 20 mm in diameter and 10 mm in thickness. The pellet was heated to 1,120° C., maintained at that temperature for 20 minutes, cooled to 1,080° C. in 1 hour, slowly cooled to 950° C. at a rate of 1° C./hour and then cooled down to room temperature in a furnace. The above treatment was performed in an atmosphere containing 99.9% Ar and 0.1% $O_2$ gas. The resulting sample was then annealed at 300° C. for 200 hours in an oxygen gas stream to obtain a superconductor having a zero resistivity temperature of 96.5 K. The electron probe microanalysis revealed that this sample had a composition range of $Nd_{0.9-0.99}Ba_{2.01-2.1}Cu_3O_{6.5-7.0}$.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A process for the production of a metal oxide superconductor having the following formula:

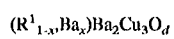

$(R^1_{1-x}Ba_x)Ba_2Cu_3O_d$ wherein R1 stands for at least one element selected from the group consisting of La, Nd, Sm, Eu and Gd, x is a number greater than 0 and less than or equal to 0.5 and d is a number greater than or equal to 6.2 and less than or equal to 7.2, said process comprising:

providing a melt having a temperature of 1,000°–1,300° C. and containing $R^1$, Ba, Cu and O in such amounts that the content of $R^1$ is 0.3–0.6 mole, the content of Ba is 0.6–0.8 mole and the content of O is 2.1–2.7 moles each per mole of Cu; and cooling said melt at a cooling rate of 5° C./hour or less under a partial pressure of oxygen of between 0.00001 and 0.05 atm, to thereby form a superconducting phase.

2. A process as claimed in claim 1, wherein said cooling is performed while maintaining a temperature gradient of 5° C./cm or more in the direction along which a crystal of the superconducting phase grows.

3. A process as claimed in claim 1, further comprising annealing said superconducting phase at a temperature in the range of 250°–600° C. in an oxygen atmosphere.

* * * * *

UNITED STATES PATENT AND TRADEMARK OFFICE
CERTIFICATE OF CORRECTION

PATENT NO. : 5,525,584
DATED : June 11, 1996
INVENTOR(S) : Murakami et al

It is certified that error appears in the above-indentified patent and that said Letters Patent is hereby corrected as shown below:

Col. 2, line 30, "$(R^2_{-z9}Ba_z)$" should read -- $(R^2_{1-z}, Ba_z)$ --.

Col. 4, line 31, "aria" should read -- an --.

Col. 5, line 2, "EMBODIMENT" should read --EMBODIMENTS--.

Col. 6, line 22, "$O_p^{\cdot}$" should read --$O_p$--.

Col. 7, line 16, "0,001" should read --0.001--.

Col. 8, line 40, "$Sm_2O_3$" should read --$Sm_2O_3$--;

Col. 9, line 6, "$Sm_2O_3$" should read --$Sm_2O_3$--.

Signed and Sealed this

Twenty-seventh Day of May, 1997

Attest:

BRUCE LEHMAN

*Attesting Officer*     *Commissioner of Patents and Trademarks*